United States Patent [19]

Mangold et al.

[11] 3,787,784

[45] Jan. 22, 1974

[54] CIRCUIT ARRANGEMENT FOR APPLYING A TEMPERATURE STABILIZED VOLTAGE TO A VOLTAGE SENSITIVE COMPONENT

[75] Inventors: Hans Mangold; Walter Klein, both of Fuerth, Germany

[73] Assignee: Grundig E.M.V. Elektro-Mechanische Versuchsanstalt Max Grundig, Fuerth, Bayern, Germany

[22] Filed: Feb. 15, 1972

[21] Appl. No.: 226,464

[30] Foreign Application Priority Data

Feb. 18, 1971 Germany .......................2107714

[52] U.S. Cl. ............................... 331/177 V, 334/15

[51] Int. Cl. ............................................ H03b 5/00

[58] Field of Search......... 331/177 V, 36 C; 334/15; 332/30 V

[56] References Cited

UNITED STATES PATENTS 3,117,293 1/1964 Mortley............................ 331/36 C 3,521,204 7/1970 Nilssen et al. ........................ 334/15

3,654,557 4/1972 Sakamoto et al. .................... 334/15

*Primary Examiner*—John Kominski

*Attorney, Agent, or Firm*—Michael S. Striker

[57] ABSTRACT

A selected one of a plurality of temperature stabilized tuning voltages is applied at a tuning output to a resonant circuit for varying the frequency thereof. Each tuning voltage is selectively applied to the tuning output by a switching transistor and an isolating diode. All isolating diodes have one electrode connected to a common line. A temperature compensating diode or the base emitter circuit of a temperature compensating transistor are connected between the common line and the tuning output. A single temperature compensating element thus compensates for temperature variations in any of the diodes.

8 Claims, 2 Drawing Figures

CIRCUIT ARRANGEMENT FOR APPLYING A TEMPERATURE STABILIZED VOLTAGE TO A VOLTAGE SENSITIVE COMPONENT

BACKGROUND OF THE INVENTION

The present invention relates to frequency adjustable resonant circuits, and in particular to a circuit arrangement for applying temperature stabilized tuning potentials to a voltage sensitive resonant frequency circuit.

Resonant circuits whose resonant frequencies can be selectively changed by means of a capacitance diode of adjustable capacitance are well known. Preadjusted tuning potentials are applied to the adjustable capacitance in said circuits to cause changes in capacitance and therefore changes in the resonance frequency of a circuit, such as in an oscillator. Circuit arrangements of this kind may be used, for example, in television receivers. However, when a plurality of potentials are applied to the switching transistors, the potentials may each have to be taken from an output electrode of the respective switching transistor by way of an isolating diode to prevent interference or interaction between the various switching transistors. This is advantageous in order to prevent such reaction which may affect the individual tuning potentials appearing at the voltage variable capacitance, and since the resultant frequency may be a very sensitive function of the applied voltage. Also, such an interaction of potentials appearing across the output electrodes of a turned on switching transistor may have adverse effects on the switching transistors which are not in the conductive state. Isolating diodes have been effective to solve this problem. However, the provision of the isolating diodes has presented other problems. The modified circuit arrangements do not operate completely satisfactorily because the tuning potentials applied to the capacitance diodes vary with changing temperatures as a result of the temperature coefficient of the isolating diodes. This has resulted in the problem that frequency stability as a function of temperature has been compromised in return for the advantage of increased isolation. Because frequency stability is extremely important in television reception, test instrumentation and other such purposes, changes in frequency as a function of temperature often cannot be tolerated.

SUMMARY OF THE INVENTION

Accordingly, it is an object of the present invention to provide an arrangement for applying a temperature stabilized voltage to a voltage sensitive component which does not have the disadvantages known in the prior art.

It is another object of the present invention to provide a circuit arrangement for applying a temperature stabilized voltage to a voltage sensitive component which is simple in construction and economical to manufacture and which assures that the temperature variations contributed by isolating diodes are compensated for.

According to the present invention a circuit arrangement is provided for applying a temperature stabilized voltage to a voltage sensitive component. Such a circuit arrangement comprises an isolating diode through which the voltage is transmitted to said voltage sensitive component. Said isolating diode has an anode-cathode junction path. A semiconductor junction device has its junction arranged between the cathode of said isolating diode and said voltage sensitive circuit. The semiconductor junction device is arranged to be in the conductive state and carries a current in a direction opposite to that flowing through the diode.

The present invention seeks to reduce or prevent variations of tuning potential applied to a capacitance diode with temperature. According to one arrangement, the semiconductor junction device is a diode and according to another arrangement the semiconductor junction diode is the base-emitter junction of a transistor.

The circuit arrangement can be utilized to selectively vary the frequency of an electrical oscillatory circuit to which one of a plurality of preset tuning potentials is applied by way of a plurality of isolating diodes. All said isolating diodes are connected to said semiconductor junction device. A plurality of switching transistors may be provided for applying the tuning potentials to said isolating diode in response to the application of a control signal to said transistors. The plurality of preset tuning potentials are applied by way of the collector-emitter path of a respective switching transistor which is connected to the capacitance diode by way of the anode-cathode path of an isolating diode and by way of the cathode-anode path of a forward-biassed compensating diode connected to conduct current in an opposite direction with respect to the current direction in said isolating diode. Circuit arrangements in accordance with the present invention are advantageously employed in pretuning arrangements, especially in television receivers or in commercial transmitters. Additionally, the invention may also be used to advantage in measuring apparatus, for example, in signal generators or other apparatus which are equipped with frequency-determining resonant circuits.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figures 1, 2:
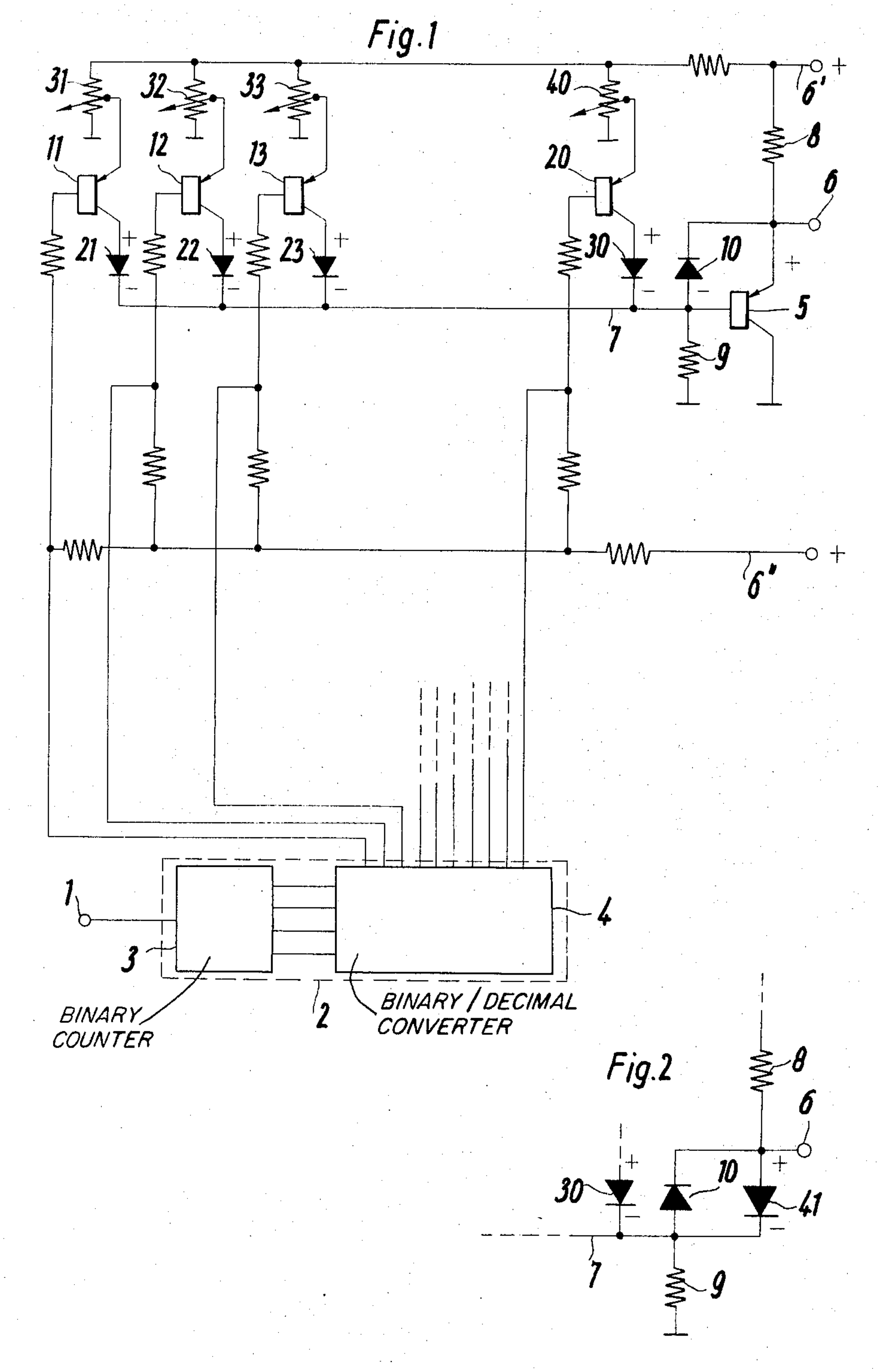
FIG. 1 is a partial schematic and partial block diagram of an electronic switching circuit for use in television receivers in accordance with the present invention, having a channel selector tunable by means of a diode which permits the selection of any one of a plurality of different frequencies.
FIG. 2 is a schematic diagram of a portion of the circuit shown in FIG. 1, showing a possible modification of the present invention.

Referring to FIG. 1, a series of switching transistors 11 to 20 are arranged as shown in FIG. 1. The switching transistors can be switched successively from left to right to provide preadjusted tuning voltages to a voltage sensitive circuit (not shown), as will be described. The switching transistors are of the PNP type, and have their emitters connected to the sliding or adjustable taps of the respective potentiometers 31 to 40. The latter potentiometers are connected between the positive supply voltage lead 6′ and the circuit reference voltage potential or circuit ground.

The collectors of the transistors 11 to 20 are connected to the common lead 7 by way of respective diodes 21 to 30. The bases of the switching transistors 11 to 20 are connected to both the positive supply voltage lead 6″ and to the electronic stepping switch 2 by means of resistor dividing networks.

The electronic stepping switch 2 comprises a binary pulse counter 3 having an input terminal 1, the counter being connected to a binary-decimal converter 4.

According to one presently preferred embodiment, the common lead 7 is connected to the base of a temperature compensating transistor 5. The emitter of the transistor 5 is connected to the positive voltage supply lead 6′ through an emitter resistor 8, while the collector of this transistor is connected to the circuit ground. A diode 10 connects the base with the emitter of the transistor while a resistance 9 connects the base to the circuit ground in the base circuit of the transistor 5.

In the circuit arrangement as described, control voltages for a series of switching transistors 11 to 20 are produced by means of the electronic stepping switch.

This latter switch consists of a pulse counter 3 operating in the binary system followed by a binary-decimal converter 4. The converter has ten outputs which are normally at a positive potential and which are switched in succession to zero potential. If, for example, two pulses are applied to the input 1 of pulse counter 3, then converter 4 moves two steps, e.g., from output 1 to output 3 so that output 3 now lies at zero potential, while the remaining outputs have a positive potential. As is known, the application of a potential on the base of a PNP transistor which is more positive in relation to the emitter causes such transistor to be in the cut off or non-conductive state. These positive potentials are applied simultaneously as blocking potentials to the bases of the PNP switching transistors 11–20, with the exception of the one transistor which is connected to the grounded output of the converter 4, this being only one transistor at any one time. In the present example, it is assumed to be transistor 13.

The emitter of each of the switching transistors 11 to 20 is connected with the slider or movable contact of a respective one of a series of potentiometers 31 to 40, by means of which the tuning potentials necessary for tuning the oscillatory circuit for receiving particular frequencies may be preset, each of these tuning potentials (e.g., that from potentiometer 33) may be switched by means of the respective switching transistor (e.g., 13) and by way of the respective one of a series of isolating diodes 21 to 30 to the common lead 7, when the base of the appropriate switching transistor is at zero potential.

By applying pulses to input 1 of the counter 3, the television receiver may thus be switched to select any of the preset television channels, the binary-decimal converter 4 sequentially switching its outputs to zero potential, this causing the bases of the respective switching transistor likewise to be grounded. The electronic stepping switch 2 is arranged so that the converter 4, after reaching the last output, automatically returns to the first output.

The tuning potentials taken from the collectors of the switching transistor 11 to 20 by way of the respective isolating diodes 21 to 30 are applied to the common lead 7. Since, however, the voltages across the diodes 21 to 30 change with temperature variations, the tuning potentials and, therefore, the resonant frequencies of the oscillatory circuit in the channel selector also changes with temperature fluctuations, as a result of which the picture reception may be substantially impaired.

In order to avoid this, a circuit arrangement is connected between the common lead 7 and the tuning output terminal 6, from which the tuning potential is now applied to the capacitance diode which is to be controlled. The circuit arrangement includes a transistor 5 operated in the common collector configuration and which is of the same conductivity type as the switching transistor, which in this case is a PNP transistor. In this manner, in addition to the desired compensation for the temperature coefficient of the diodes 21 to 30, an exact adjustment of the working point of the transistor 5 may be attained so that there is effected an impedance conversion by which the switching time-constant is substantially reduced.

The other embodiment illustrated in FIG. 2 has a mode of operation for temperature compensation which is in principle the same as that shown in FIG. 1. Here, the base-emitter junction of the transistor 5 is replaced by a diode 41. The path or the forward current direction flow in the diode 41 is opposite to the direction of current flow through the diodes 21 to 30. The emitter-base junction of the transistor 5 in FIG. 1, as well as the anode-cathode path of diode 41 is maintained in the forward conducting state by the biassing resistance 8, which is connected to the positive voltage supply lead 6′ and the resistance 9 which is connected to the circuit ground. By selecting the forward conduction characteristics of the emitter-base junction of the transistor 5 and of the diode 41 to be similar to those of the diodes 21–30, the voltage current relationship across these junctions can be adjusted to provide equal voltages across the junctions for equal current passing therethrough. In order to obtain perfect temperature compensation, it is also necessary that the temperature characteristics of the junctions be likewise similar, thus, the voltage changes across the junction as a function of temperature should vary in like manner for equal currents.

The tuning voltage at the output terminal 6 becomes substantially independent of temperature in either of the above described embodiments because the currents through both the diodes 21 to 30 and through the temperature compensating junction flow in opposite directions. Thus, for example, the current flowing through the isolating diode 23 flows from the collector of the transistor 13, through the common lead 7 and the resistance 9 to ground. The current flowing through the emitter-base junction of transistor 5 or the current flowing through the diode 41 flows from the positive voltage supply lead 6′, through the resistance 8 and through the respective temperature compensating junction and again through the resistance 9 to ground. In fact, insofar as the output terminal 6 is concerned, which is connected to the capacitance diode, the isolating diodes and the temperature compensating junctions are in series. However, because of the opposite flow of current through the isolating diodes and through the temperature compensating junctions, the voltage drops which develop across the junctions are of opposite polarity. Because of the series connections of the junctions, these two voltage drops cancel one another. For this reason, the tuning voltages at the collectors of the transistors 11 to 20 are equal to the voltages at the output terminal 6 without being influenced by any voltage drop across the isolating diodes.

In order also to obtain a small switching time constant when switching from a smaller to a greater tuning potential, a further diode 10 can be provided which is connected anti-parallel with the base-emitter path of transistor 5 or with the cathode-anode path of the diode 41.

It will be understood that each of the elements described above, or two or more together, may also find a useful application in other types of temperature stabilizer circuits differing from the types described above.

While the invention has been illustrated and described as embodied in a circuit for applying temperature stabilized tuning voltages to a capacitance diode in an oscillatory circuit for changing its resonant frequency, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. In a tuning circuit arrangement having a plurality of predetermined resonant frequencies, each in response to a corresponding tuning voltage furnished at a tuning output, a temperature-compensated system for furnishing said tuning voltages at said tuning output, comprising, in combination, a plurality of sources of tuning voltage, corresponding in number to said plurality of resonant frequencies; a plurality of switching transistors, each having an emitter connected to a corresponding one of said source of tuning voltage, a collector and a base, each for furnishing the corresponding one of said tuning voltages at said collector in response to a control signal at said base; electronic step switch means having a plurality of switching outputs, for furnishing said control signal at a selected one of said switching outputs upon external activation; first connecting means connecting each of said switching outputs of the base of a corresponding one of said switching transistors; a plurality of first diodes each having a first electrode connected to the collector of a corresponding one of said switching transistors, and a second electrode, the voltage across each of said plurality of first diodes varying as a determined function of temperature; second connecting means connecting all of said second electrodes to a common line; a temperature compensating circuit element having a first electrode connected to said common line and a second electrode connected to said tuning output, the voltage across said temperature compensating circuit element also varying as said determined function of temperature upon flow of current therethrough; and biasing means including a source of electric energy having two terminals and a conductive impedance element connected between said common line and one of said terminals of said source of electric energy, said biasing means connected to said temperature compensating circuit element for causing a current flow through said temperature compensating circuit element opposite in direction to the current flow through said first diodes and through said conductive impedance element, whereby the change in voltage across said temperature compensating circuit element as a function of temperature compensates for the corresponding change in voltage across any of said first diodes, the voltage at said tuning output thereby constituting a temperature compensated tuning voltage.

2. An arrangement as set forth in claim 1, wherein said temperature compensating circuit element is a temperature compensating diode connected with opposite polarity to said first diodes.

3. An arrangement as set forth in claim 2, and including resistance means connected between said tuning output and the other terminal of said source of electric energy.

4. An arrangement as set forth in claim 1, wherein said temperature compensating element is a temperature compensating transistor.

5. An arrangement as set forth in claim 10, wherein said temperature compensating transistor has a base-emitter circuit connected from said common line to said tuning output, and a collector connected to ground potential.

6. An arrangement as set forth in claim 2, further comprising additional diode means connected in parallel with, but with opposite polarity to, said temperature compensating diode.

7. An arrangement as set forth in claim 11, further comprising additional diode means connected in parallel with, but with opposite polarity to, said emitter-base circuit of said temperature compensating transistor.

8. An arrangement as set forth in claim 1, wherein said electronic step switch means comprise binary counter means; and binary-decimal converter means connected to the output of said binary counter means.

* * * * *